US006312866B1

(12) United States Patent
Obuchowicz et al.

(10) Patent No.: US 6,312,866 B1
(45) Date of Patent: Nov. 6, 2001

(54) FORMATION OF IMAGES

(75) Inventors: Jacek Paul Obuchowicz, Mirfield (GB); Fredrick Claus Zumsteg, Wilmington, DE (US)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/423,528

(22) PCT Filed: May 8, 1998

(86) PCT No.: PCT/EP98/02832

§ 371 Date: Jan. 6, 2000

§ 102(e) Date: Jan. 6, 2000

(87) PCT Pub. No.: WO98/51496

PCT Pub. Date: Nov. 19, 1998

(30) Foreign Application Priority Data

May 10, 1997 (GB) .................................................. 9709404

(51) Int. Cl.[7] .............................. G03C 1/76; G03F 7/004

(52) U.S. Cl. ................... 430/270.1; 430/138; 430/271.1; 430/273.1; 430/302

(58) Field of Search ................................ 430/138, 270.1, 430/271.1, 273.1, 302, 944, 945; 101/454, 467

(56) References Cited

U.S. PATENT DOCUMENTS

| | | | | |
|---|---|---|---|---|
| 3,679,410 | * | 7/1972 | Vrancken et al. | 96/27 |
| 3,793,025 | * | 2/1974 | Vrancken et al. | 96/36 |
| 5,576,129 | * | 11/1996 | Zwartz et al. | 430/41 |
| 5,580,689 | * | 12/1996 | Chen et al. | 430/41 |
| 5,948,591 | * | 9/1999 | Vermeersch et al. | 430/270.1 |
| 5,948,596 | * | 9/1999 | Zhong et al. | 430/278.1 |
| 5,948,599 | * | 9/1999 | Gardner et al. | 430/330 |
| 5,981,144 | * | 11/1999 | Damme et al. | 430/271.1 |
| 6,014,929 | * | 1/2000 | Teng | 101/456 |
| 6,022,667 | * | 2/2000 | Vermeersch et al. | 430/271.1 |
| 6,071,369 | * | 6/2000 | Vermeersch et al. | 156/272.8 |
| 6,106,996 | * | 8/2000 | Van Damme et al. | 430/271.1 |
| 6,197,478 | * | 3/2001 | Vermeersch et al. | 430/272.1 |

FOREIGN PATENT DOCUMENTS 599 510 * 6/1994 (EP) .

* cited by examiner

*Primary Examiner*—Janet Baxter
*Assistant Examiner*—Barbara Gilmore
(74) *Attorney, Agent, or Firm*—Breiner & Breiner, L.L.C.

(57) ABSTRACT

The invention provides a radiation sensitive plate which is imageable by exposure to thermal radiation and comprises (a) a substrate; (b) an imaging layer containing a disperse phase comprising a water insoluble heat softenable component, a continuous phase comprising a component which is soluble or swellable in aqueous medium and a substance capable of strongly absorbing radiation and transferring the energy as heat to the disperse phase to cause at least partial coalescence of the coating; and (c) a topmost covering layer having an optical density which is lower than that of the imaging layer at the wavelength of exposure and contains either a combination of a disperse phase and a continuous phase, or a polymer resin which is soluble or dispersible in aqueous medium.

29 Claims, No Drawings

FORMATION OF IMAGES

FIELD OF THE INVENTION

This invention relates to image formation and is concerned with the formation of images directly from electronically composed digital sources.

For many years it has been a long term aim in the printing industry to form printing images directly from an electronically composed digital database, i.e. by a so-called "computer-to-plate" system. The advantages of such a system over the traditional methods of making printing plates are:

(i) the elimination of the costly intermediate silver film and processing chemicals;

(ii) a saving of time; and (iii) the ability to automate the system with consequent reduction in labour costs.

The introduction of laser technology provided the first opportunity to form an image directly on a printing plate precursor by directing a laser beam at sequential areas of the plate precursor and modulating the beam so as to vary its intensity. In this way, radiation sensitive plates comprising a high sensitivity photocrosslinkable polymer have been exposed with water-cooled UV argon-ion lasers and electrophotographic plates having sensitivity stretching from the visible spectral region into the near infra-red region have been successfully exposed using low-powered air-cooled argon-ion and semiconductor laser devices.

Imaging systems are also available which involve a sandwich structure which, on exposure to a heat generating infra-red laser beam, undergoes selective (imagewise) delamination and a subsequent transfer of materials. Such so-called peel-apart systems are generally used as replacements for silver halide films.

The present applicants have previously disclosed, in EP-A-514,145 a method of image formation which comprises: providing a radiation sensitive plate comprising a substrate and a coating containing a heat softenable disperse phase, an aqueous soluble or swellable continuous phase and a radiation absorbing substance; imagewise exposing the plate to at least partially coalesce the particles of the disperse phase in the image areas; and developing the imagewise exposed plate to remove the coating in the unexposed areas. The directly imaged plates thus obtained may then be used to provide printed images in the normal way using a conventional printing press.

The plates obtained in this way, however, were found to have rather poor durability in printing operations; in particular, they suffered from poor run length on the press. This drawback was believed to be associated with the fact that the at least partial coalescence of the particles of the disperse phase which occurred during imagewise exposure involved a purely physical mixing process. Consequently, it was concluded that more satisfactory performance would be achieved by the use of a system in which new chemical bond formation could be induced in image areas of the plates prior to their use on a printing press, thus providing a greater image toughness and durability.

Accordingly, EP-A-599,510 teaches a method of image formation as previously disclosed in EP-A-514,145, but which additionally comprises the step of heating the developed plate or subjecting it to irradiation to effect insolubilisation of the image. In this way, good quality images of high durability are obtained.

Such insolubilisation is brought about by chemical reaction between one or more of the components of the coating, which occurs as a result of the heating or irradiation treatment. In order to facilitate such chemical interactions, it is necessary that at least one of the heat softenable disperse phase and the aqueous soluble or swellable continuous phase should include a chemically reactive grouping or precursor therefor.

Despite the improvements which have been effected in this way, however, some further difficulties have been experienced with plates of the type disclosed in EP-A- 599,510. In particular, the very short exposure times associated with laser imaging techniques inevitably mean that it is extremely difficult to achieve uniform heating throughout the coating, since the film surface is heated substantially more than those regions well below the surface. As a consequence, surface overheating can occur, causing damage to, or ablation of, the surface material. As well as leading to poor image formation, weak images and potentially impaired press performance, such overheating may also give rise to a plume of ablated debris and pyrolysis products that can attenuate and deflect the imaging laser beam.

Therefore, the present invention seeks to overcome the difficulties associated with surface overhearing which have been experienced with prior art thermally imageable printing plates.

According to one aspect of the present invention, there is provided a radiation sensitive plate, imageable by exposure to thermal radiation, which comprises a substrate coated with:

(i) an imaging layer which comprises (1) a disperse phase comprising a water insoluble heat softenable component (A) and (2) a binder or continuous phase consisting of a component (B) which is soluble or swellable in aqueous, preferably aqueous alkaline, medium;

(ii) a substance (C) capable of strongly absorbing radiation and transferring the energy thus obtained as heat to the disperse phase so that at least partial coalescence of the coating occurs, said substance being contained either within the imaging layer (i) or in a separate layer; and (iii) a topmost covering layer having, at the chosen wavelength of exposure, an optical density which is lower than that of the imaging layer (i), said covering layer comprising at least one of the following.

(1) a disperse phase comprising a water-insoluble heat softenable component (D) and a binder or continuous phase consisting of a component (E) which is soluble or swellable in aqueous, preferably aqueous alkaline, medium;

(2) a polymer resin (F) which is soluble in aqueous medium; or (3) a polymer resin (G) which is dispersible in aqueous or alcoholic medium, but insoluble in aqueous alkaline medium.

Optionally, the topmost covering layer may also contain a substance (H) capable of strongly absorbing radiation and transferring the energy thus obtained as heat to the disperse phase.

Preferably, the topmost covering layer comprises (iii) (1), containing (D), (E) and the optional component (H) these components optionally being the same as (A), (B) and (C) respectively, References below to components A, B and C also apply to components D, E and H respectively.

The components A and E are preferably polymers and/or oligomers, at least one of which contains reactive groupings or precursors, thus providing a system in which at least one of the following conditions is fulfilled:

a) Component A is crosslinkable;

b) Component B is crosslinkable;

c) Component A reacts with component B to form a crosslinked structure:

d) Component A is a mixture of two or more materials A1, A2, A3, etc. which are either mutually reactive and/or react with component B;

e) Component B is a mixture of two or more materials B1, B2, B3 etc. which are either mutually reactive and/or react with component A.

The imaging layer contains discrete domains of components A and B. The disperse or discontinuous phase A is encapsulated by the continuous phase B. The two phases A and B may form a core-shell system, as described in EP-A-514,145, in which case the core and shell components may be linked together via chemical bonding. Under ambient conditions, both components are preferably solid and immobile.

Component B may, for example, be incorporated in the composition of the coating through its use as a binder in predispersed pigmentary material added to the composition as the radiation-absorbing substance.

In practice, it is desirable to select components such that the components of the coating will not react sufficiently under normal storage conditions to hinder the imaging and development processes, but will react sufficiently rapidly at elevated temperatures to give a durable, solvent resistant image. This lack of reactivity at ambient temperature may result from the mutually reactive groups being present each in a distinct domain, so that reaction only occurs on coalescence; thus, premature reaction is effectively prevented by the use of separate phases. In the alternative, stability may be achieved by the incorporation of a system such that commencement of reaction only occurs to a significant extent on reaching and exceeding a specified threshold temperature.

The component A may be an oleophilic polymer or oligomer, preferably having a minimum film forming temperature (MFT) above ambient temperature, and it may be an addition copolymer comprising residues derived from one or more monomers which may, by way of illustration, be selected from one or more groups from each of (i) and (ii) below:

(i) Styrene, substituted styrenes, esters of (meth)acrylic acid, vinyl halides, (meth)acrylonitrile, vinyl esters;

(ii) Glycidyl (meth)acrylate, allyl glycidyl ether, allyl (meth)acrylate, chloromethylstyrene, isocyanate and blocked isocyanate functional materials, eg isocyanatoethyl methacrylate and its phenol blocked derivatives, amino functional monomers, eg dimethylaminoethyl methacrylate, acetoacetoxyethyl methacrylate, N-methylol acrylamide and its derivatives.

Alternatively, component A may be a bisphenol A epichlorohydrin epoxy resin or other suitable epoxy or polyether resin, or may be derived from a condensation polymer such as a polyester or polyurethane with (optionally blocked) reactive side or terminal groups.

The component B is preferably polymeric and contains carboxylic acid, sulphonamide, or other groups capable of conferring solubility, or at least swellability, in aqueous solutions. Particularly suitable materials for component B are:

(i) copolymers derived from the copolymerisation of one or more ethylenically unsaturated carboxylic acids with one or more of styrene, substituted styrenes, (meth) acrylate esters, (meth)acrylonitrile or vinyl acetate;

(ii) dicarboxylic acid half esters of hydroxyl group-containing polymers, such as phthalic, succinic or maleic acid half esters of a polyvinyl acetal and, in particular, of a polyvinyl butyral; and (iii) alkyl or aralkyl half esters of styrene—or allyl vinyl ether-maleic anhydride copolymers, in particular alkyl half esters of styrene-maleic anhydride copolymers such as Scripset 540 (Monsanto).

The continuous and discontinuous phases may be prepared using core-shell polymerisation techniques as described in EP-A-514,145, or may be obtained by simple mixing of components A and B after particle formation. The weight ratio of component B to component A is preferably in the range of from 1:20 to 20:1, and more preferably is in the range of from 1:9 to 1:1.

The radiation-absorbing substance C may be any suitable laser radiation- absorbing material of the type widely known to those skilled in the art, and may include, for example, carbon black, graphite, phthalocyanine, or any of a range of croconium and squarylium type dyestuffs. Component C is present in an amount which is effective to cause some coalescence of the coating under the influence of the high intensity radiation. Component C may be chosen to be sensitive to lasers omitting radiation over a range of wavelengths, in which case carbon black and graphite would be suitable materials. Alternatively, the use of various dyes allows for sensitivity to specific wavelengths to be achieved. The radiation-absorbing substance will typically constitute from 0.1 to 80%, by weight, of the coating.

The polymer resin F may be any polymeric resin showing solubility in aqueous alkaline medium, and is typically a cresol novolak resin, a carboxy functional (meth)acrylate resin or any other suitable (co)polymer selected from the materials detailed above which may comprise component B.

The polymer resin G may be any of a range of aqueous or alcohol dispersible resins showing negligible or no solubility in aqueous alkaline media and includes, for example, polyvinylidene chloride, polyvinyl chloride and polyurethane resins.

The material used for the substrate depends upon the purpose for which the image is to be used and may be for example, a metal or a plastics material In the case where the image is to be used as a printing image, the substrate is preferably aluminium, most preferably electrochemically roughened aluminium which includes a surface anodic oxide layer.

The imaging layer may be formed on the substrate using either aqueous or non-aqueous vehicles, or mixtures thereof in order to obtain a radiation sensitive plate. It is important, however, that component A should be insoluble in the chosen vehicle or mixture. The imaging layer is preferably coated on to the substrate at a coating weight of 0.1 to 5.0 $g/m^2$ most preferably 0.8 to 1.2 $g/m^2$.

The topmost covering layer may be subsequently coated over the imaging layer using an aqueous, optionally aqueous alkaline, medium to give a layer having a preferred coating weight of 0.01 to 5.0 $g/m^2$ most preferably 0.1 to 1.0 $g/m^2$. The topcoat layer may optionally contain other additives, including film-forming agents, dyes antifoams, toughening agents, eg clays or silicous, rheological modifiers, coalescing agents, plasticisers and the like.

According to another aspect of the present invention, there is provided a method of forming an image which comprises:

(a) providing a radiation sensitive plate according to the invention;

(b) imagewise exposing the radiation sensitive plate to a beam of high intensity radiation by directing the radiation at sequential areas of the coating and modulating the radiation so that the particles in the imaging layer are selectively at least partially coalesced;

(c) developing the imagewise exposed plate with aqueous medium to selectively remove the areas containing the non-coalesced particles and leave an image on the substrate resulting from the at least partially coalesced particles; and (d) heating the developed plate and/or subjecting it to actinic radiation to effect insolubilisation.

In a particular embodiment of the invention, the source of the high intensity radiation is a laser operating in the ultra-violet, visible or infra-red region of the spectrum. Red and infra-red light emitting lasers are typically used, for example the semiconductor or diode lasers, typical of which is the gallium aluminium arsenide laser which operates in the 750–870 nm region, and neodymium—YAG lasers which operate around 1064 nm.

Preferred developers for selectively removing the non-coalesced material in the non-image areas are aqueous alkalis, such as solutions of ethanolamine and sodium metasilicate, an alkaline phosphate such as sodium phosphate, or an alkali metal hydroxide in water.

The plates of the present invention overcome the difficulties associated with prior art materials, since the presence of the topmost covering layer gives rise to more uniform heating throughout the coating. In addition, ablative resistance is significantly improved, and further benefits are observed in terms of increased surface reflectivity, longer run length, better solvent resistance and improved handleability, pressure sensitivity, glass and scratch resistance.

The following examples are, without limitation, illustrative of the invention.

EXAMPLES

SYNTHESIS EXAMPLES

Example 1

To a 500 ml flanged flask equipped with condenser, mechanical stirrer, nitrogen inlet/exit, thermometer, temperature probe and two inlet feeds was added 250 ml of distilled water and 1.73 g of sodium lauryl sulphate washed in with 10 ml of distilled water. The temperature was raised to 65° C., a nitrogen blanket was applied and the solution was stirred during the addition of a solution of 0.87g of ammonium persulphate in 10 ml of distilled water. Stirring was continued for a further 30 minutes.

A monomer mixture A was prepared from 71.94 g of styrene, 12.76 g of glycidyl methacrylate and 1.20 g of bromotrichloromethane, and a second monomer material B was prepared by dissolving 1.20 g of Bisomer SEM (ammonium sulphatoethyl methacrylate supplied by International Speciality Chemicals) in 25 ml of distilled water. 10% of each of the monomer mixtures A and B was added via the inlet feeds, with stirring, during 20 minutes to the reaction solution, and the resultant mixture was stirred at 65° C. for a further 30 minutes. The remaining monomer mixtures A and B were added at a constant feed rate over 3 hours, the inlets then being flushed with a further 10 ml of distilled water before stirring the whole under nitrogen at 65° C. for a further hour.

The resultant latex L1 was kegged off and found to have a monomer content of <0.01%, a particle size <300 nm and a solids content of 20%.

Example 2

To a 500 ml flanged flask equipped with condenser, mechanical stirrer nitrogen inlet/exit, thermometer, temperature probe and two inlet feeds was added 43 ml of Carboset XL37 (alkali soluble carboxylated acrylic resin, available from B.F. Goodrich, 35% solids dispersion), followed by 200 ml of distilled water and 10 ml of aqueous ammonia (S.G. 0.880). The mixture was stirred until clear, 0.9 g of ascorbic acid and 1.48 g of potassium persulphate were added, the temperature was raised to 35° C., and a nitrogen blanket was then applied. Stirring was continued for a further 30 minutes.

Monomer mixtures A and B were prepared as described in Example 1, and 10% of each of these mixtures was added via the inlet feeds, with stirring, during 20 minutes to the above solution, and the resulting mixture was stirred at 35° C. for a further 30 minutes. The remaining monomer mixtures A and B were added at a constant feed rate over 3 hours, the inlets being flushed with a further 10 ml of distilled water before stirring the whole under nitrogen at 35° C. for a further 5 hours. The resulting latex L2 was kegged off and found to have a monomer content of <0.01%, a particle size <300 nm and a solids content of 25% w/w.

Example 3

To a 500 ml flanged flask equipped with condenser, mechanical stirrer, nitrogen inlet/exit, thermometer, temperature probe and inlet feed was added 250 ml of distilled water and 1.73 g of sodiumn lauryl sulphate washed in with 10 ml of distilled water. The temperature was raised to 65° C., a nitrogen blanket was applied and the solution was stirred during the addition of a solution of 0.87 g of ammonium persulphate in 10 ml of distilled water. Stirring was continued for a further 30 minutes.

A monomer mixture was prepared from 67.5 g of styrene, 7.5 g of Cylink IBMA monomer (N-(isobutoxymethyl)-acrylamide supplied by Cytec, Wayne, N.J.) and 3.0 g of bromotrichloromethane, and 10% of this mixture was added via the inlet feed, with stirring, during 20 minutes to the reaction solution, and the resultant mixture was stirred at 65° C. for a further 30 minutes. The remaining monomer mixture was added at a constant feed over 3 hours, the inlet then being flushed with a further 10 ml of distilled water before stirring the whole under nitrogen at 65° C. for a further hour.

The resultant latex L3 was kegged off and found to have a monomer content of <0.01%, a particle size <300 nm and a solids content of 20%.

Example 4

To a 500 ml flanged flask equipped with condenser, mechanical stirrer, nitrogen inlet/exit, thermometer, temperature probe and is inlet feed was added 250 ml of distilled water and 1.73 g of sodium lauryl sulphate washed in with 10 ml of distilled water. The temperature was raised to 65° C., a nitrogen blanket was applied and the solution was stirred during the addition of a solution of 0.87 g of ammonium persulphate in 10 ml of distilled water. Stirring was continued for a further 30 minutes.

A blocked isocyanate derivative was prepared by reacting methyl ethyl ketone oxime with isocyanatoethyl methacrylate in anhydrous toluene using standard synthetic techniques. After purification, 10 g of the adduct so obtained was mixed with 65 g of styrene and 3 g of bromotrichloromethane, and 10% of the resulting mixture was added via the inlet feed, with stirring, during 20 minutes to the reaction solution, and the mixture obtained was stirred at 65° C. for a further 30 minutes. The remaining monomer mixture was added at a constant feed rate over 3 hours, the inlet then being flushed with a further 10 ml of distilled water before stirring the whole under nitrogen at 65° C. for a further hour.

The resulting latex L4 was kegged off and found to have a monomer content of <0.01%, a particle size <300 nm and a solids content of 20% w/w.

COATING EXAMPLES

Example 5

50 g of a 12% w/w solids content coating mixture was prepared as follows:

14.2 g of a pigment dispersion P1 prepared by milling 1.09 g of Degussa FW2V (a carbon black pigment) with 1.33 g of a phthalic acid half ester of polyvinyl butyral in 2.71 g of isopropanol and 8.96 ml of distilled water containing 0.14 ml of aqueous ammonia (S.G. 0.880) was stirred with 3.9 g of a solution of 0.3 g of the phthalic acid half ester of polyvinyl butyral in 0.8 g of isopropanol and 2.66 ml of distilled water containing 0.03 ml of aqueous ammonia (S.G. 0.880), and 3.8 g of isopropanol was added.

15.2 g of the latex L1 was stirred with 13 ml of distilled water, and the resultant mixture was added dropwise, with stirring, to the above dispersion. When the addition was complete, the quality of the coating material obtained was verified by means of an optical microscope to ensure high dispersion quality.

The coating material was coated on to a grained and anodised aluminium substrate to give a coat weight of 0.9 g/m.

A topcoat formulation was prepared by mixing together 33 g of latex L1, 7 g of binder solution S and 10 g of pigment dispersion P1 using the same technique as for the preparation of the above coating. The topcoat was applied to the previously prepared plate by means of a K Bar 5 using an Easicoater coating apparatus to give an overcoat weight of 0.5 g/m$^2$. The plate was then heated to 50° C. for 30 seconds in order to dry the coating. The resulting plate showed improved pressure sensitivity, gloss and scratch resistance when compared with an analogous plate which did nor include a topcoat.

The plate was exposed by an array of 32×100 mW laser diodes (Creo Products Inc., Burnaby, Canada) at a nominal 10 micron beam width giving an exposure of 330 mJ/cm$^2$, to effect at least partial coalescence of the particles in the radiation struck areas of the coating.

A very high quality image was obtained after development in a sodium metasilicate based developer (Unidev, from DuPont Printing and Publishing) to remove the non-coalesced areas of the coating.

The plate was baked for five minutes at 250° C., then finished with an acidified solution of an anionic surfactant (Unifin, from DuPont Printing and Publishing). The resulting plate showed good resistance to solvents such as toluene and 1-methoxy-2-propanol and gave in excess of 100,000 copies on a web offset press. The plate was also very stable on storage, and could be imaged and decoated many months after preparation. The baking response was not significantly diminished after this time.

Example 6

60 g of an 8% w/w solids content coating mixture was prepared from:

12.0 g of latex L1;

9.15 g of a 16.4% solids Microlith Black CWA dispersion (prepared by stirring Microlith Black CWA pigment (a carbon black pigment) from Ciba Geigy Pigments, Manchester UK with a mixture of water and isopropanol (23:77), and then adding 1% w/w of aqueous ammonia (S.G. 0.880));

13.25 ml of distilled water 15.0 g of isopropanol

The mixture was coated on to a grained and anodised aluminium substrate to give a coat weight of 0.9 g/m$^2$. In this case, component (B), which comprises the binder or continuous phase, is the alkali soluble binder associated with the carbon black pigment.

A topcoat formulation was prepared by mixing together 35 g of latex L1 and 15 g of a 16.4% solids microlith Black CWA dispersion. The topcoat was applied to the previously prepared plate by means of a K Bar 5 using an Easicoater coating apparatus to give an overcoat weight of 0.5 g/m$^2$. The plate was then heated to 50° C. for 30 seconds in order to dry the coating. The resulting plate showed improved pressure sensitivity, gloss and scratch resistance when compared with an analogous plate which did not include a topcoat.

The plate was exposed by an array of 32×100 mW laser diodes (Creo Products Inc., Burnaby, Canada) at a nominal 10 micron beam width giving an exposure of 330 mJ/cm$^2$, to effect at least partial coalescence of the particles in the coating in the radiation-struck areas.

A very high quality image was obtained after development in a sodium metasilicate based developer (Unidev, from DuPont Printing and Publishing) to remove the non-coalesced areas of the coating.

The plate was baked for five minutes at 250° C., then finished with an acidified solution of an anionic surfactant (Unifin, from DuPont Printing and Publishing). The resulting plate showed good resistance to solvents and gave in excess of 100,000 copies on a web-offset press. The plate was stable on storage and the baking response was not diminished after many months.

Example 7

A grained and anodised aluminium substrate was coated with a 12% w/w solids coating composition as described in Example 5.

A topcoat formulation was prepared by mixing together 37.5 g of latex L1 and 12.5 g of a solution containing 0.85 g of the phthalic acid half ester of polyvinyl butyral in 11.55 ml of distilled water and 0.1 ml of aqueous ammonia (S.G. 0.880). The topcoat was applied to the above plate by means of a K Bar 5 using an Easicoater coating apparatus to give an overcoat weight of 0.3 g/m$^2$. The plate was heated at 50° C. for 30 seconds in order to dry the coating. The plate showed improved pressure sensitivity, gloss and scratch resistance when compared with an analogous plate which did not include a topcoat.

The plate was exposed, developed, baked and finished as described in Example 5 to give a plate showing good solvent resistance, storage stability and baking response, and giving in excess of 100,000 copies on a web offset press.

Example 8

A grained and anodised aluminium substrate was coated with an 8% w/w solids coating composition as described in Example 6.

A topcoat formulation was prepared by dissolving 3.4 g of the phthalic acid half ester of polyvinyl butyral in 46.1 ml of distilled water and 0.5 ml of aqueous ammonia (S.G. 0.880). The topcoat was applied to the above plate by means of a K Bar 5 using an Basicoater coating apparatus to give an overcoat weight of 0.3 g/m$^2$. The plate was heated at 50° C. for 30 seconds in order to dry the coating. The plate showed improved pressure sensitivity, gloss and scratch resistance when compared with an analogous plate which did not include a topcoat.

Scratch resistance was measured using a Linimark tester. Various loads were applied and results taken for scratch damage to the plate surface both on and off the image area.

Non-topcoated plate

Load 113 g Exposure sensitivity 180 mJ/cm$^2$

Topcoated plate

Load 142 g Exposure sensitivity 180 mJ/cm$^2$

The figures are for the load required to give a scratch width of between 50–100 $\mu$m which is likely to affect the print quality.

The results show that even a thin topcoat has increased the scratch resistance of the plate without detriment to the exposure sensitivity.

The plate was exposed, developed, baked and finished as described in Example 6 to give a plate showing minimal ablative damage, good storage stability and ease of handleability, and giving in excess of 100,000 copies on a web offset press.

Example 9

A grained and anodised aluminium substrate was coated with a 12% w/w solids coating composition as described in Example 5.

A topcoat formulation was prepared and applied to the above plate in the same way as described in Example 8 to give a plate showing improved pressure sensitivity, gloss and scratch resistance when compared with an analogous plate which did not include a topcoat.

The plate was exposed, developed, baked and finished as described in Example 5 to give a plate showing minimal ablative damage, good storage stability ad ease of handleability, and giving in excess of 100,000 copies on a web offset press.

Example 10

A grained and anodised aluminium substrate was coated with a 12% w/w solids coating composition as described in Example 5.

A topcoat formulation was prepared by dispersing 2.5 g of NeoRez R-987 (a polyurethane resin) in 50 ml of distilled water. The topcoat was applied to the above plate by means of a K Bar 5 using an Easicoater coating apparatus to give an overcoat weight of 0.3 g/m$^2$. The plate was heated at 50° C. for 30 seconds in order to dry the coating. The plate showed improved pressure sensitivity, gloss and scratch resistance when compared with an analogous plate which did not include a topcoat.

The plate was exposed, developed, baked and finished as described in Example 5 to give a plate showing minimal ablative damage, good solvent resistance, storage stability and ease of handleability, and giving in excess of 100,000 copies on a web offset press.

Example 11

A 9% w/w solids content coating dispersion was prepared from:

21.6 g of latex L2;

21.95 g of a 16.4% solids Microlith Black CWA dispersion (prepares as described in Example 6):

6.45 ml of distilled water and 50 g of isopropanol.

The mixture was coated on to a grained and anodised aluminium substrate to give a coat weight of 0.9 g/m$^2$. In this case, component A was a styrene/glycidyl methacrylate copolymer, and component B was the combination of the carboxylated acrylic resin associated with component A, and alkali soluble bender associated with the carbon black pigment.

A topcoat formulation was prepared by mixing together 35 g of latex L2 and 15 g of a 16.4% solids Microlith Black CWA dispersion. The topcoat was applied to the previously prepared plate by means of a K Bar 5 using an Tasicoater coating apparatus to give an overcoat weight of 0.5 g/m$^2$. The plate was then heated to 50° C. for 30 seconds in order to dry the coating. The resulting plate showed improved pressure sensitivity, gloss and scratch resistance when compared with an analogous plate which did not include a topcoat.

The plate was exposed, developed, baked and finished as described in Example 6 to give a plate having a very high quality image and showing excellent solvent resistance, as well as giving in excess of 100,000 copies on a web offset press. In addition, the plate was very stable in storage and could be imaged and decoated many months after preparation. The baking response was not significantly diminished after this time.

Example 12

A grained and anodised aluminium substrate was coated with a 9% w/w solids coating composition as described in Example 11.

A topcoat formulation was prepared and applied to the above plate in the same way as described in Example 10 to give a plate showing improved pressure sensitivity, gloss and scratch resistance when compared with an analogous plate which did not include a topcoat.

The plate was exposed, developed, baked and finished as described in Example 6 to give a plate showing minimal ablative damage, good solvent resistance, storage stability and ease of handleability, and giving in excess of 100,000 copies on a web offset press.

Example 13

50 g of an 8% w/w solids content coating mixture was prepared from:

12.0 g of latex L3;

9.75 g of a 16.4% solids Microlith Black CWA dispersion (prepared as described in Example 6);

13.25 ml of distilled water; and 15.0 g of isopropanol.

The mixture was coated on to a grained and anodised aluminium substrate to give a coat weight of 0.9 g/m$^2$. In this case, component A was a styrene/N-(isobutoxymethyl)-acrylamide copolymer and component B was the alkali soluble binder associated with the carbon black pigment.

A topcoat formulation was prepared by mixing together 35 g of latex L3 and 15 g of a 16.4% solids Microlith Black CWA dispersion. The topcoat was applied to the previously prepared plate by means of a K Bar 5 using an Easicoater coating apparatus to give an overcoat weight of 0.5 g/m$^2$. The plate was then heated to 50° C. for 30 seconds in order to dry the coating. The resulting plate showed improved pressure sensitivity, gloss and scratch resistance when compared with an analogous plate which did not include a topcoat.

The plate was exposed, developed, baked and finished as described in Example 6 to give a plate having a very high quality image and showing excellent solvent resistance, as well as giving in excess of 100,000 copies on a web offset press. In addition, the plate was very stable on storage and could be imaged and decoated many months after preparation. The baking response was not significantly diminished after this time.

Example 14

A grained and anodised aluminium substrate was coated with an 8% w/w solids coating composition as described in Example 13.

A topcoat formulation was prepared and applied to the above plate in the same way as described in Example 8 to give a plate showing improved pressure sensitivity, gloss and scratch resistance when compared with an analogous plate which did not include a topcoat.

The plate was exposed, developed, baked and finished as described in Example 6 to give a plate showing minimal ablative damage, good solvent resistance, storage stability and ease of handleability, and giving in excess of 100,000 copies on a web offset press.

Example 15

A pigment dispersion P2 was prepared by ball milling the following materials for 40 hours:

4.0 g of Acrylsol I-62 (hydroxy and carboxy functional acrylic resin as aqueous colloidal dispersion, 50% solids, available from Rohm and Haas, Philadelphia);

2.0 g of Degussa FW2V (carbon black pigment);

0.4 g of triethylamine; and 25 ml of distilled water.

A coating composition comprising 135 g of latex L4, 14.0 g of pigment dispersion P2, 10 ml of distilled water and 12.5 g of isopropanol was prepared and coated on to a grained and anodised aluminium substrate to give a coat weight of 0.9 g/m$^2$. In this case, component A was a copolymer of styrene and the methyl ethyl ketone oximelisocyanatoethyl methacrylate adduct, and component B was the hydroxy and carboxy-functional acrylic resin.

A topcoat formulation was prepared by mixing together 35 g of latex L4 and 15 g of pigment dispersion P2. The topcoat was applied to the previously prepared plate by means of a K Bar 5 using an Easicoater coating apparatus to give an overcoat weight of 0.5 g/m$^2$.

The plate was then heated to 50° C. for 30 seconds in order to dry the coating. The resulting plate showed improved pressure sensitivity, gloss and scratch resistance when compared with an analogous plate which did not include a topcoat.

The plate was exposed, developed, baked and finished as described in Example 6 to give a plate having a very high quality image and showing excellent solvent resistance, as well as giving in excess of 100,000 copies on a web offset press. In addition, the plate was very stable in storage and could be imaged and decoated many months after preparation. The baking response was not significantly diminished after this time.

Example 16

A grained and anodised aluminium substrate was coated with a is coating composition as described in Example 15.

A topcoat formulation was prepared by mixing together 37.5 g of latex L4 and 12.5 g of a solution containing 2.0 g of Acrylsol I-62, 0.2 g of triethylamine, 0.1 g of SQS (a squarylium dye) and 12.5 ml of distilled water. The topcoat was applied of the above plate by means of a K Bar 5 using an Easicoater coating apparatus to give an overcoat weight of 0.3 g/m$^2$. The plate was heated at 50° C. for 30 seconds in order to dry she coating. The plate showed improved pressure sensitivity, gloss and scratch resistance when compared with an analogous plate which did not include a topcoat.

The plate was exposed, developed, baked and finished as described in Example 6 to give a plate having a very high quality image, showing good solvent resistance, storage stability and baking response, and giving in excess of 100,000 copies on a web offset press.

What is claimed is:

1. A radiation sensitive plate, imageable by exposure to thermal radiation, which comprises a substrate coated with:

(i) an imaging layer which comprises (1) a disperse phase comprising a water insoluble heat softenable component (A) and (2) a binder or continuous phase consisting of a component (B) which is soluble or swellable in aqueous medium;

(ii) a substance (C) capable of strongly absorbing radiation and transferring the energy thus obtained as heat to the disperse phase so that at least partial coalescence of the coating occurs, said substance being contained either within the imaging layer (i) or in a separate layer; and (iii) a topmost covering layer having, at the chosen wavelength of exposure, an optical density which is lower than that of the imaging layer (i), said covering layer comprising at least one of the following:

(1) a disperse phase comprising a water-insoluble heat softenable component (D) and a binder or continuous phase consisting of a component (E) which is soluble or swellable in aqueous medium;

(2) a polymer resin (F) which is soluble in aqueous medium; or (3) a polymer resin (G) which is dispersible in aqueous or alcoholic medium, but insoluble in aqueous alkaline medium, wherein component (A) and/or component (D) comprises one or more oleophilic polymers or oligomers, at least one of which contains reactive groupings or precursors.

2. A radiation sensitive plate as defined in claim 1 wherein the topmost covering layer (iii) additionally contains a substance (H) capable of strongly absorbing radiation and transferring the energy thus obtained as heat to the disperse phase in the topmost covering layer.

3. A radiation sensitive plate as defined in claim 2 wherein the topmost covering layer (iii) comprises a disperse phase comprising a water-insoluble heat softenable component (D) and a binder or continuous phase consisting of a component (E) which is soluble or swellable in aqueous medium.

4. A radiation sensitive plate as defined in claim 3 wherein the components (D), (E) and (H) are the same as components (A), (B) and (C), respectively.

5. A radiation sensitive plate as defined in any of claims 1–4 wherein components (A) and (B) and/or (D) and (E) each independently form a core-shell system.

6. A radiation sensitive plate as defined in claim 1 wherein component (A) and/or component (D) comprises one or more additional polymers comprising residues derived from one or more monomers selected from each of:

(i) styrene, substituted styrenes, esters of (meth)acrylic acid, vinyl halides, (meth)acrylonitrile or vinyl esters; and (ii) glycidyl (meth)acrylate, allyl glycidyl ether, allyl (meth)acrylate, chloromethylstyrene, isocyanate and blocked isocyanate functional materials, amino functional monomers, acetoacetoxyethyl (meth)acrylate or N-methylol acrylamide and its derivatives.

7. A radiation sensitive plate as defined in claim 1 wherein component A and/or component (D) comprises an epoxy or polyether resin or a derivative of a polyester or polyurethane resin.

8. A radiation sensitive plate as defined in claim 1 wherein component (B) and/or component (E) comprises a polymer containing groups capable of conferring solubility or swellability in aqueous solutions.

9. A radiation sensitive plate as defined in claim 8 wherein component B and/or component (E) contains carboxylic acid or sulphonamido groups.

10. A radiation sensitive plate as defined in claim 9 wherein component (B) and/or component (E) comprises a copolymer derived from the copolymerisation of one or more ethylenically unsaturated carboxylic acids with one or more of styrene, substituted styrenes, (meth)acrylate esters, (meth)acrylonitrile or vinyl acetate.

11. A radiation sensitive plate as defined in claim 9 wherein component (B) and/or component (E) comprises a dicarboxylic acid half-ester of a hydroxyl group containing polymer.

12. A radiation sensitive plate as defined in claim 11 wherein component (B) and/or component (E) comprises a phthalic, succinic or maleic acid half ester of a polyvinyl acetal.

13. A radiation sensitive plate as defined in claim 12 wherein the polyvinyl acetal is polyvinyl butyral.

14. A radiation sensitive plate as defined in claim 9 wherein component (B) and/or component (E) comprises an alkyl or aralkyl half ester of a sytrene- or allyl vinyl ether-maleic anhydride copolymer.

15. A radiation sensitive plate as defined in claim 1 wherein the weight ratio of component (B) to component (A) and the weight ratio of component (E) to component (D) are both in the range of from 1:20 to 20:1.

16. A radiation sensitive plate as defined in claim 15 wherein said weight ratios are both in the range of from 1:9 to 1:1.

17. A radiation sensitive plate as defined in claim 1 wherein component (C) and/or component (H) comprises carbon black, graphite, or phthalocyanine, croconium or squarylium type dyestuffs.

18. A radiation sensitive plate as defined in claim 1 wherein polymer resin (F) comprises a cresol novolak resin or a polymer containing carboxylic acid or sulphonamido groups.

19. A radiation sensitive plate as defined in claim 1 wherein polymer resin (G) comprises polyvinylidene chloride, polyvinyl chloride or a polyurethane resin.

20. A radiation sensitive plate as defined in claim 1 wherein the substrate comprises a metal or plastics material.

21. A radiation sensitive plate as defined in claim 20 wherein the metal is electrochemically roughened aluminum which includes a surface anodic oxide layer.

22. A radiation sensitive plate as defined in claim 1 wherein the imaging layer is coated onto the substrate at a coating weight of 0.1 to 5.0 g/m$^2$.

23. A radiation sensitive plate as defined in claim 22 wherein said imaging layer is coated onto said substrate at a coating weight of 0.8 to 1.2 g/m$^2$.

24. A radiation sensitive plate as defined in claim 1 wherein the topmost covering layer is coated over the imaging layer at a coating weight of 0.01 to 5.0 g/m$^2$.

25. A radiation sensitive plate as defined in claim 24 wherein said topmost covering layer is coated over said imaging layer at a coating weight of 0.1 to 1.0 g/m$^2$.

26. A radiation sensitive plate as defined in claim 1 wherein the topmost covering layer additionally contains at least one of film forming agents, dyes, antifoams, toughening agents, rheological modifiers, coalescing agents or plasticizers.

27. A method of image formation which comprises:

(a) providing a radiation sensitive plate as defined in claim 1;

(b) imagewise exposing the radiation sensitive plate to a beam of high intensity radiation by directing the radiation at sequential areas of the coating and modulating the radiation so that the particles in the imaging layer are selectively at least partially coalesced;

(c) developing the imagewise exposed plate with aqueous medium to selectively remove the areas containing the non-coalesced particles and leave an image on the substrate resulting from the at least partially coalesced particles; and (d) heating the developed plate and/or subjecting it to actinic radiation to effect insolubilization.

28. A method of image formation as defined in claim 27 wherein the source of the high intensity radiation is a laser operating in the ultra-violet, visible or infra-red region of the spectrum.

29. A method of image formation as defined in claim 28 wherein the laser is a gallium aluminum arsenide or neodymium-YAG laser.

* * * * *

UNITED STATES PATENT AND TRADEMARK OFFICE
CERTIFICATE OF CORRECTION

PATENT NO. : 6,312,866 B1
DATED : November 6, 2001
INVENTOR(S) : Jacek Paul Obuchowicz et al.

It is certified that error appears in the above-identified patent and that said Letters Patent is hereby corrected as shown below:

Title page,
Item [86], § 371 Date, "Jan. 6, 2000" should read -- Jan. 11, 2000 --;
Item [86], § 102(e) Date, "Jan. 6, 2000" should read -- Jan. 11, 2000 --;

Column 4,
Line 41, insert a -- . -- after "material".

Column 7,
Line 20, "3.9 g" should read -- 3.8 g --;
Line 33, "g/m" should read -- $g/m^2$ --;

Column 8,
Line 2, "9.15 g" should read -- 9.75 g --;
Line 17, "microlith" should read -- Microlith --.

Signed and Sealed this

Fourteenth Day of May, 2002

*Attest:*

JAMES E. ROGAN

*Attesting Officer*

*Director of the United States Patent and Trademark Office*

UNITED STATES PATENT AND TRADEMARK OFFICE

CERTIFICATE OF CORRECTION

PATENT NO. : 6,312,866 B1
DATED : November 6, 2001
INVENTOR(S) : Jacek Paul Obuchowicz et al.

It is certified that error appears in the above-identified patent and that said Letters Patent is hereby corrected as shown below:

Title page,
Item [86], § 371 Date, "Jan. 6, 2000" should read -- Jan. 11, 2000 --;
Item [86], § 102(e) Date, "Jan. 6, 2000" should read -- Jan. 11, 2000 --;

Column 4,
Line 41, insert a -- . -- after "material".

Column 7,
Line 20, "3.9 g" should read -- 3.8 g --;
Line 33, "g/m" should read -- $g/m^2$ --;

Column 8,
Line 2, "9.15 g" should read -- 9.75 g --;
Line 17, "microlith" should read -- Microlith --.

Column 9,
Line 42, "ad" should read -- and --;

Column 10,
Line 3, "prepares" should read -- prepared --;
Line 16, "Tasicoater" should read -- Easicoater --;

Column 11,
Line 38, "135 g" should read -- 13.5 g --;
Line 67, delete "is";

UNITED STATES PATENT AND TRADEMARK OFFICE
CERTIFICATE OF CORRECTION

PATENT NO. : 6,312,866 B1
DATED : November 6, 2001
INVENTOR(S) : Jacek Paul Obuchowicz et al.

It is certified that error appears in the above-identified patent and that said Letters Patent is hereby corrected as shown below:

<u>Column 12,</u>
Line 8, "she" should read -- the --.

This certificate supersedes Certificate of Correction issued May 14, 2002.

Signed and Sealed this

Twelfth Day of November, 2002

*Attest:*

JAMES E. ROGAN

*Attesting Officer*

*Director of the United States Patent and Trademark Office*